United States Patent
Song et al.

(10) Patent No.: US 9,348,184 B2
(45) Date of Patent: May 24, 2016

(54) LIQUID CRYSTAL DISPLAY DEVICE, ARRAY SUBSTRATE AND METHOD FOR MANUFACTURING THE SAME

(71) Applicant: BEIJING BOE OPTOELECTRONICS TECHNOLOGY CO., LTD., Beijing (CN)

(72) Inventors: Sung Hun Song, Beijing (CN); Juncai Ma, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 151 days.

(21) Appl. No.: 13/704,811

(22) PCT Filed: Oct. 22, 2012

(86) PCT No.: PCT/CN2012/083330
§ 371 (c)(1),
(2) Date: Dec. 17, 2012

(87) PCT Pub. No.: WO2013/091437
PCT Pub. Date: Jun. 27, 2013

(65) Prior Publication Data
US 2014/0071365 A1    Mar. 13, 2014

(30) Foreign Application Priority Data
Dec. 22, 2011   (CN) .......................... 2011 1 0436208

(51) Int. Cl.
*G02F 1/136*   (2006.01)
*G02F 1/1333*   (2006.01)
(Continued)

(52) U.S. Cl.
CPC .......... *G02F 1/1362* (2013.01); *G02F 1/13439* (2013.01); *G02F 1/134363* (2013.01); *H01L 33/08* (2013.01); *G02F 1/133707* (2013.01)

(58) Field of Classification Search
CPC .................... G02F 1/134372; G02F 1/133707; G02F 1/133345; G02F 2001/133357; G02F 1/134336; G02F 1/134363; G02F 1/13439
USPC ........................... 349/43, 122, 138, 155–157
See application file for complete search history.

(56) References Cited

U.S. PATENT DOCUMENTS 8,072,569 B2 * 12/2011 Kaneko et al. ................ 349/141
2003/0179325 A1 * 9/2003 Rho .................. G02F 1/133345
349/43

(Continued)

FOREIGN PATENT DOCUMENTS

| CN | 1904699 A | 1/2007 |
|---|---|---|
| CN | 101034215 A | 9/2007 |
| CN | 101614917 A | 12/2009 |
| JP | 2012047840 A | 3/2012 |

OTHER PUBLICATIONS

International Search Report Issued Jan. 22, 2013; Appln. No. PCT/CN2012/083330.

(Continued)

*Primary Examiner* — Nathanael R Briggs
(74) *Attorney, Agent, or Firm* — Ladas & Parry LLP

(57) ABSTRACT

Embodiments of the present invention provide a liquid crystal display device, an array substrate and a method for manufacturing the same. The liquid crystal display device comprises a color filter substrate and an array substrate which are assemblied together to form a cell, the array substrate comprising gate lines, data lines and a plurality of pixel units defined by intersecting of the gate lines and the date lines, each of which comprises a pixel electrode, wherein barrier structures are disposed on both sides of the data lines and the gate lines.

15 Claims, 4 Drawing Sheets

(51) Int. Cl.
*G02F 1/1339* (2006.01)
*G02F 1/1362* (2006.01)
*H01L 33/08* (2010.01)
*G02F 1/1343* (2006.01)
*G02F 1/1337* (2006.01)

(56) References Cited

U.S. PATENT DOCUMENTS

2004/0257510 A1* 12/2004 Chae ................ G02F 1/134363
　　　　　　　　　　　　　　　　　　　　　　349/141
2008/0068539 A1* 3/2008 Kaneko ............ G02F 1/134363
　　　　　　　　　　　　　　　　　　　　　　349/106
2010/0181569 A1* 7/2010 Kim ................................ 257/59
2010/0230682 A1* 9/2010 Song et al. ...................... 257/59
2011/0032445 A1* 2/2011 Kim et al. ....................... 349/43

OTHER PUBLICATIONS

International Preliminary Report on Patentability Issued Jun. 24, 2014' Appln. No. PCT/CN2012/083330.

First Chinese Office Action dated Dec. 1, 2014; Appln. No. 2011104362084.

Chinese Patent Certificate Appln. No. CN102778793B; Dated Jun. 24, 2015.

* cited by examiner

LIQUID CRYSTAL DISPLAY DEVICE, ARRAY SUBSTRATE AND METHOD FOR MANUFACTURING THE SAME

TECHNICAL FIELD

Embodiments of the present invention relate to a liquid crystal display device, an array substrate and a method for manufacturing the same.

BACKGROUND

In the advanced super dimension switch (ADSDS) technology, i.e., the ADS technology, a multi-dimensional electric field can be formed with both an electric field produced at edges of slit electrodes on the same plane and an electric field produced between a slit electrode layer and a plate-like electrode layer, so that liquid crystal molecules at all orientations, which are located directly above the slit electrodes and between the slit electrodes in a liquid crystal cell, can be rotated and aligned, which enhances the work efficiency of liquid crystals and increases light transmittance. The ADS technology can improve the picture quality of TFT-LCDs and has advantages of high resolution, high light transmission efficiency, low power consumption, wide view angle, high aperture ratio, low aberration, no push Mura, etc. Furthermore, the ADS technology can overcome the problem of low light transmission efficiency of the In-Plane-Switching (IPS) technology, and realize high light transmission efficiency with wide view angles.

The ADS technology is different from the IPS technology in that, a liquid crystal panel using the ADS technology (ADS liquid crystal panel) has common electrodes that are slit electrodes and pixel electrodes that are plate-like electrodes, and the common electrodes and the pixel electrodes are disposed in different layers and are formed of transparent electrodes so as to realize high light transmission efficiency. In addition, a distance between the pixel electrodes of an ADS liquid crystal panel can be smaller than that of an IPS liquid crystal panel, so a stronger multiple-dimensional electric field can be generated, and effective voltages acting on the liquid crystal can be increased, which results in a decreased driving voltage and an improved light transmission efficiency.

As shown in FIG. 1, which is a cross-sectional diagram showing a liquid crystal panel using the ADS technology in the prior art, the light crystal panel being formed by assembling an upper substrate and a lower substrate to form cell with a liquid crystal layer filled between the substrates. Generally, the upper substrate, i.e., the color filter substrate may comprise a transparent substrate (e.g. a glass substrate) 19; a light shielding film or a black matrix 2, a color resin film 3 and a overcoat film 4, which are formed on an inner side of the transparent substrate 19; and a conductive film (e.g. an outer ITO film) 1 for preventing static charges formed on an outer side of the transparent substrate 19. The lower substrate, i.e., the array substrate, may comprise a transparent substrate (e.g. a glass substrate) 12; and a first conductive film (e.g. a first ITO film) 11, an insulating layer 10, an amorphous silicon layer (a-Si) 9, data lines 8, a passivation layer 7 and a second conductive film (e.g. a second ITO film) 6 formed on the transparent substrate 12. A liquid crystal (LC) layer 5 is filled between the upper substrate and the lower substrate. The first conductive film 11 functions as common electrodes, which are plate-like electrodes, and the second conductive film 6 functions as pixel electrodes, which are slit electrodes comprising hollow slits. FIG. 2 is a partial plan view showing a lower substrate, i.e., an array substrate of the liquid crystal panel using the ADS technology in the prior art. As shown in FIG. 2, the array substrate of the ADS liquid crystal panel may comprise, for example, data lines 8, common electrodes 11, pixel electrodes 6, contact holes 13, source/drain electrodes 14 of the amorphous silicon thin film transistor 9 and gate lines 15. FIG. 3 is a cross-sectional diagram taken in a region of "A" in FIG. 2. As shown in FIG. 3, the insulation layer 10 is located on the common electrodes 11, the amorphous silicon thin film transistor 9 is located on the insulation layer 10, the data lines 8 are located on the amorphous silicon thin film transistor 9, the passivation layer 7 is located on the data lines 8, and the pixel electrodes 6 are located on the passivation layer.

However, during driving of the liquid crystal panel using the ADS technology, electrical fields applied to the liquid crystal around the data lines are in different directions because the common electrodes of the liquid crystal panel are located below the pixel electrodes. Therefore, when a white picture is displayed (a sufficient voltage is required to be applied), a liquid crystal orientation fault 16 occurs at ends of the pixel electrodes (referring to FIG. 4), which results in a phenomenon of partially displaying black color and displaying at different luminance. As shown in FIG. 4, when the liquid crystal panel is touched, the liquid crystal orientation fault 16 of the pixels at the touched point may further extend inwardly so that the area with different luminance may further expand and can not recover even if the touch is removed.

SUMMARY

In an embodiment of the present invention, an array substrate is provided, and comprises gate lines, data lines and a plurality of pixel units defined by intersecting of the gate lines and the date lines, each of which comprises a pixel electrode, wherein barrier structures are disposed on both sides of the data lines and the gate lines.

In another embodiment of the present invention, a method for manufacturing an array substrate is provided, and comprises: forming data lines, an insulating layer, thin film transistors, data lines and a passivation layer; and forming barrier structures on both sides of the data lines or the gate lines, and forming pixel electrodes.

In another embodiment of the present invention, a liquid crystal display device is provided, and comprises a color filter substrate and an array substrate which are assembled together to form a cell, the array substrate comprising gate lines, data lines and a plurality of pixel units defined by intersecting of the gate lines and the date lines, each of which comprises a pixel electrode, wherein barrier structures are disposed on both sides of the data lines and the gate lines.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION OF EMBODIMENTS

Figure 1:
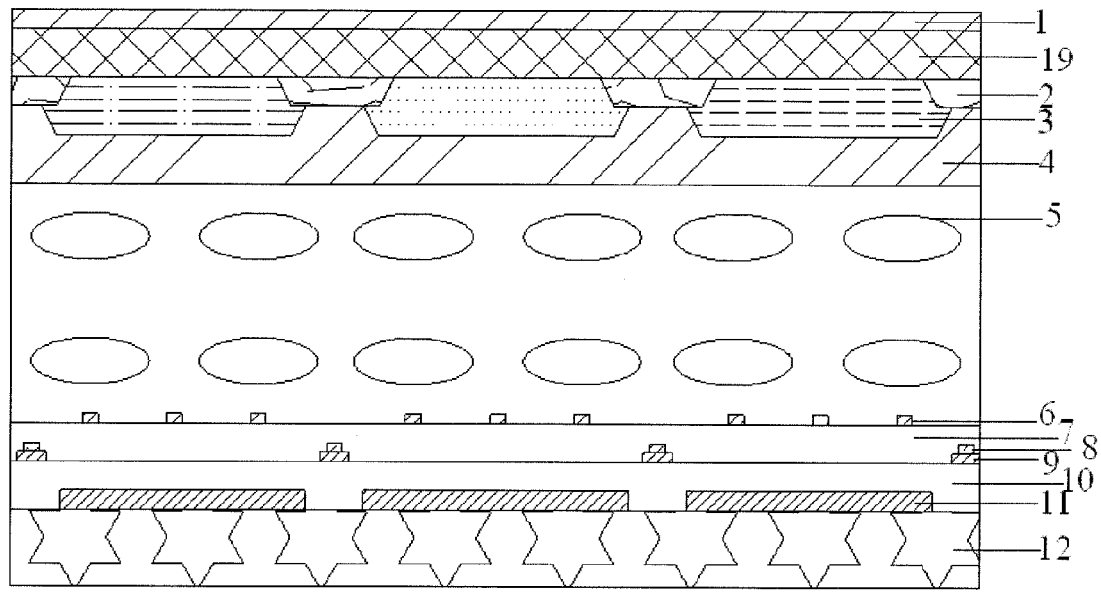
FIG. 1 is a cross-sectional diagram showing a liquid crystal panel using the ADS technology in the prior art.

In order to make objects, technical details and advantages of the embodiments of the invention apparent, the technical solutions of the embodiments will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at lease one. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

An embodiment of the present invention provides an array substrate which can prevent the liquid crystal orientation fault from extending inwardly by providing barrier structures on both sides of the data lines or the gates lines and can prevent a phenomenon of displaying at different luminance when the liquid crystal panel is touched. The embodiment of the present invention also provides a method for manufacturing the above array substrate and a liquid crystal display device comprising the above array substrate.

The array substrate provided in an embodiment of the present invention may comprise gate lines, data lines and a plurality of pixel units defined by intersecting of the gate lines and the date lines, and each of the pixel unit comprises a pixel electrode. The barrier structures are disposed on both sides of the data lines or the gate lines for preventing the liquid crystal orientation fault.

In the embodiment of the present invention, each of the pixel units may further comprises a common electrode covering a whole pixel region. The pixel electrode is in a slit shape, and the barrier structures are located between the pixel electrodes and the common electrodes and may be concave structures, each of which has a length larger than a width of slits. In this way, it is possible to overcome the phenomenon of displaying at different luminance or prevent the liquid crystal orientation fault from extending inwardly more effectively.

In the embodiment of the present invention, the array substrate may further comprise a passivation layer or an insulation layer, and the barrier structures can be formed on portions of the passivation layer or the insulation layer corresponding to non-displaying regions of the pixel units.

In the embodiment of the present invention, the material of the barrier structures may comprise, for example, silicon nitride, silicon dioxide or a resin material.

In the embodiment of the present invention, the barrier structures may be convex structures or concave structures.

Since the passivation layer, the insulation layer and the planarizing film are formed of, e.g., silicon nitride or silicon dioxide generally, and the color resin film are formed of a resin material generally, when the barrier structures are formed of silicon nitride, silicon dioxide or a resin material, it is not necessary to prepare other materials for the barrier structures and the barrier structures can be formed by using the materials of the passivation layer, the insulating layer, the planarizing film or the color resin film, so as to reduce costs.

In the following, the array substrate provided in the embodiments of the present invention will be described with reference to FIGS. 5 to 8.

Figure 5:
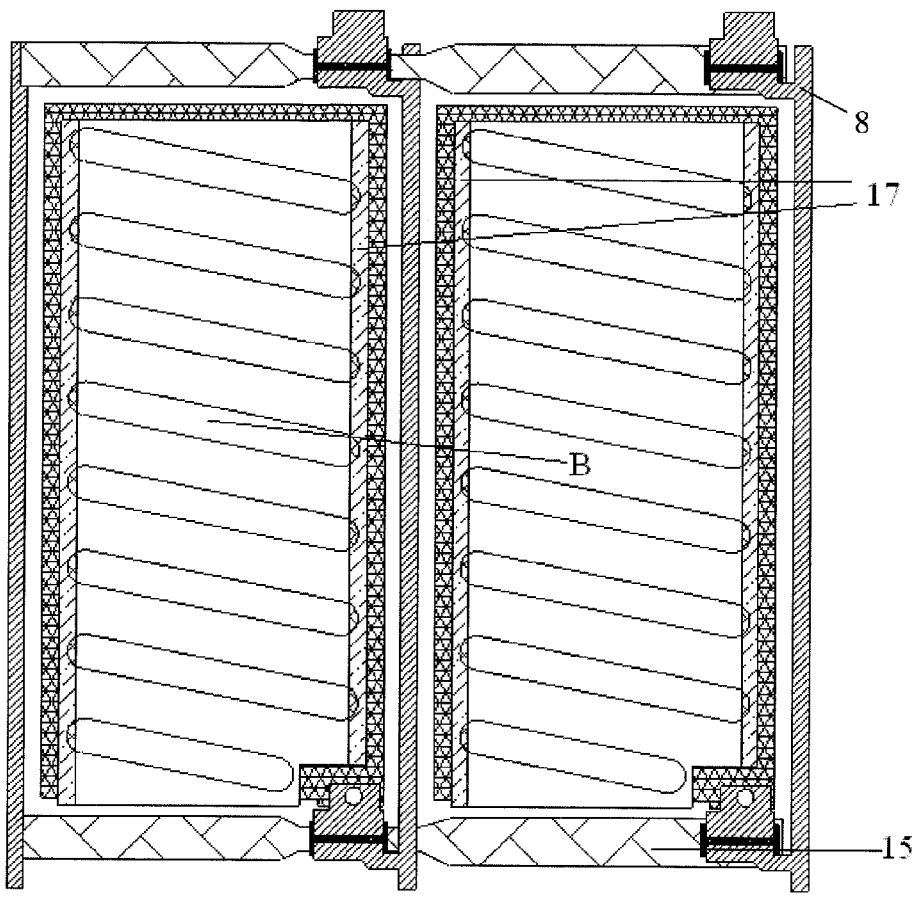
FIG. 5 is a partial plan view showing an array substrate in an embodiment of the present invention, in which a barrier structure for preventing the liquid crystal orientation fault is a convex structure.
Figure 6:
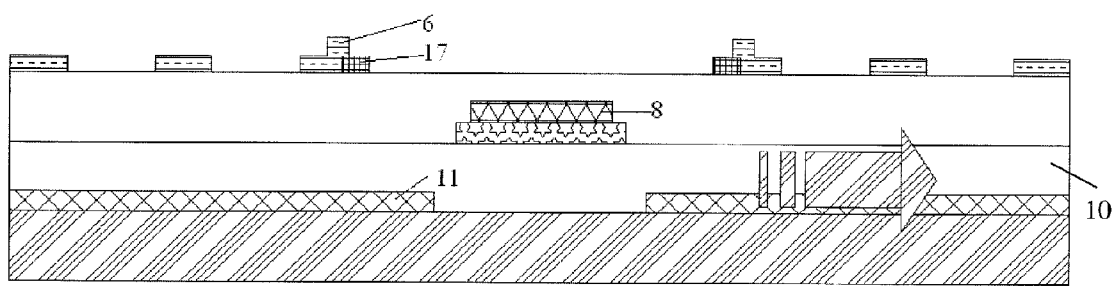
FIG. 6 is a cross-sectional diagram taken in a region of B in FIG. 5.

In the embodiment of the present invention, the barrier structures may be convex structures. In this case, as shown in FIGS. 5 and 6, the array substrate can comprise gate lines 15, data lines 8 and a plurality of pixel units defined by intersecting of the gate lines 15 and the date lines 8, and each of the pixel units comprises a common electrode 11 and a pixel electrode 6. Convex structures 17 as the barrier structures are disposed on both sides of the data lines 8 and each has a length side not longer than that of the pixel electrode 6. In this case, it is possible to overcome the phenomenon of displaying at different luminance or prevent the liquid crystal orientation fault from extending inwardly more effectively.

In the embodiment of the present invention, the convex structures 17 have a thickness larger than that of the pixel electrodes 6, or the convex structures 17 can extend to below an end of the pixel electrode 6 so as to raise the end of the pixel electrode 6. In this case, it is possible to overcome the phenomenon of displaying at different luminance or prevent the liquid crystal orientation fault from extending inwardly more effectively.

Figure 7:
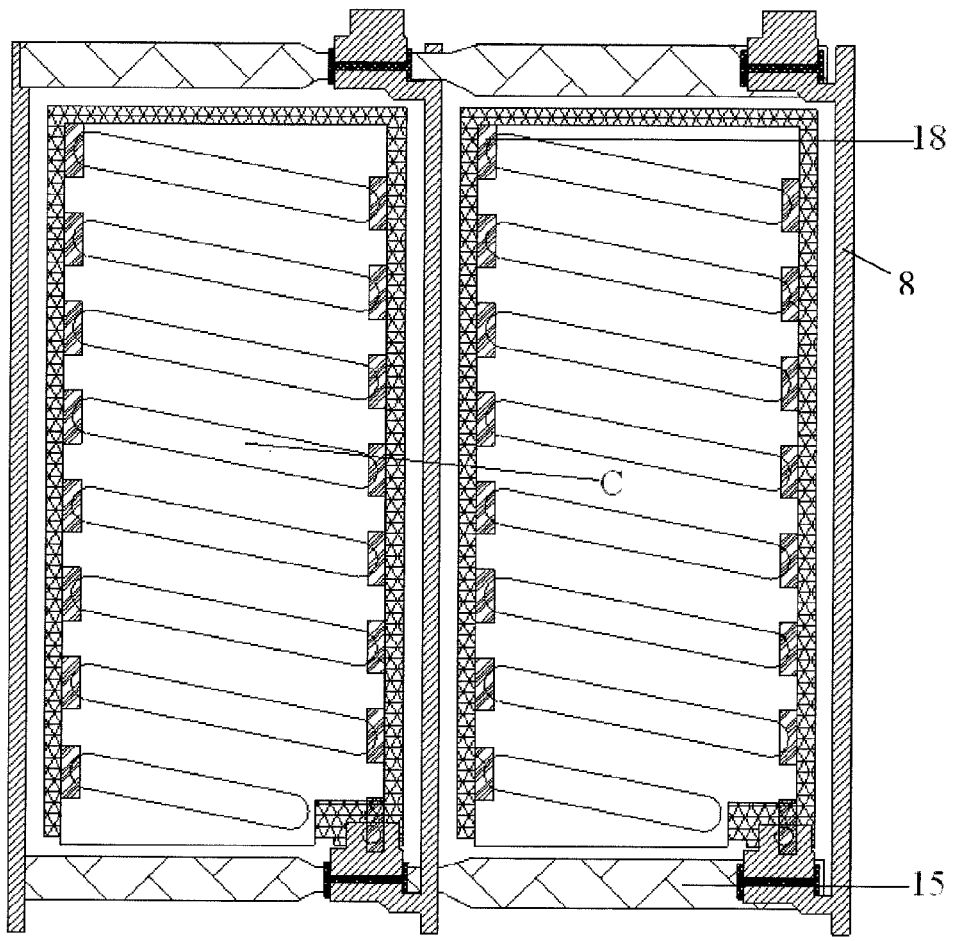
FIG. 7 is a partial plan view showing an array substrate in an embodiment of the present invention, in which a barrier structure for preventing the liquid crystal orientation fault is a concave structure.
Figure 8:
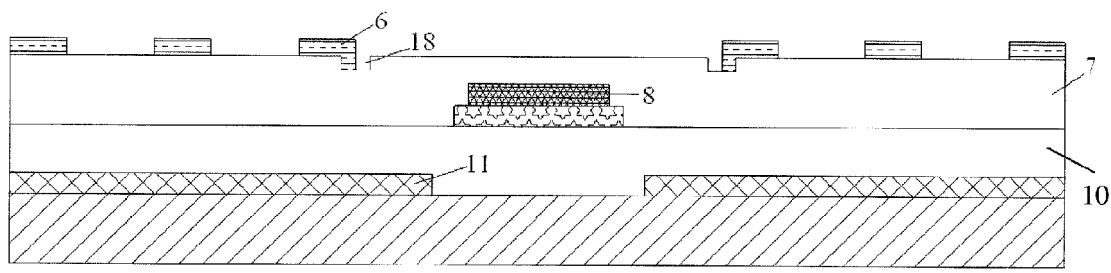
FIG. 8 is a cross-sectional diagram taken in a region of C in FIG. 7.

In the embodiment of the present invention, the barrier structures may be concave structures. In this case, as shown in FIGS. 7 and 8, the array substrate can comprise gate lines 15, data lines 8 and a plurality of pixel units defined by intersecting of the gate lines 15 and the date lines 8, each of which comprises a common electrode 11 and a pixel electrode 6. Concave structures 18 as the barrier structures are disposed on both sides of the data lines 8, and formed in portions of the passivation layer 7 corresponding to the non-displaying regions of the pixel units. In this embodiment, the concave structure 18 is formed in the passivation layer 7, but in another embodiment of the present invention, the concave structure 18 may be formed in the insulation layer 10 also.

In the embodiment of the present invention, the barrier structures can be formed by depositing, photolithograph, or etching processes; or by printing, pressing, or spraying processes.

Although the barrier structures are disposed on both sides of the data lines in the above embodiments of the present invention, the barrier structure can be disposed on both sides of the gate lines in another embodiment of the present invention as well. In this case, if the barrier structures are convex structures, each of the convex structures has a length side shorter than that of the gate lines.

In the array substrate provided in the embodiments of the present invention, since the film layers between the common electrodes, the pixel electrodes and the data lines (or the gate lines) are different in height, the electrical field can be controlled to prevent the liquid crystal orientation fault and prevent the phenomenon of displaying pictures at different luminance from extending to inside of the pixels.

An embodiment of the present invention provides a method for manufacturing an array substrate, for manufacturing the array substrates as shown in FIGS. 5 to 8. The method for manufacturing the array substrate provided in the embodiment of the present invention may comprise, for example, the following steps.

Step 101: forming gate lines, common electrodes, an insulation layer, thin film transistors, data lines and a passivation layer, wherein a plurality of pixel units are defined by intersecting of the gate lines and data lines.

Figure 2:
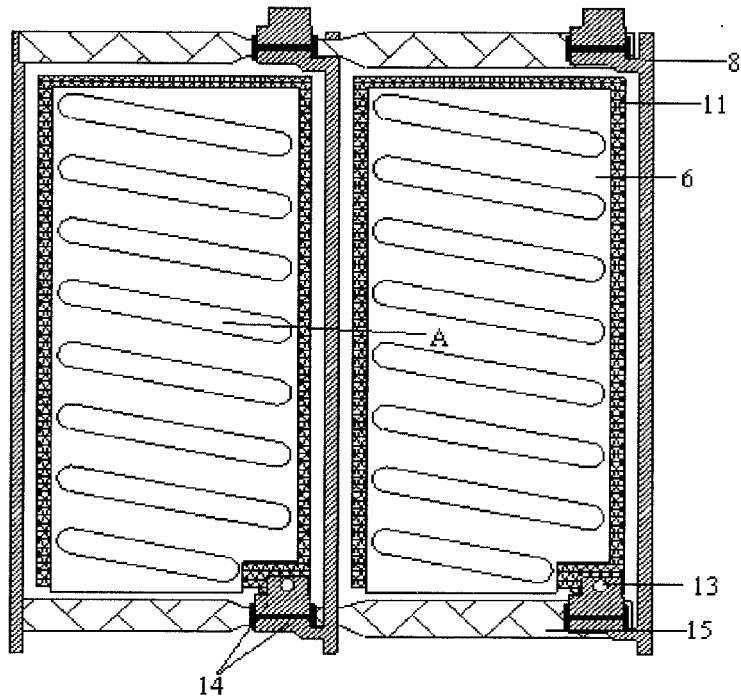
FIG. 2 is partial plan view showing a lower substrate, i.e., an array substrate of the liquid crystal panel using the ADS technology in the prior art.
Figure 3:
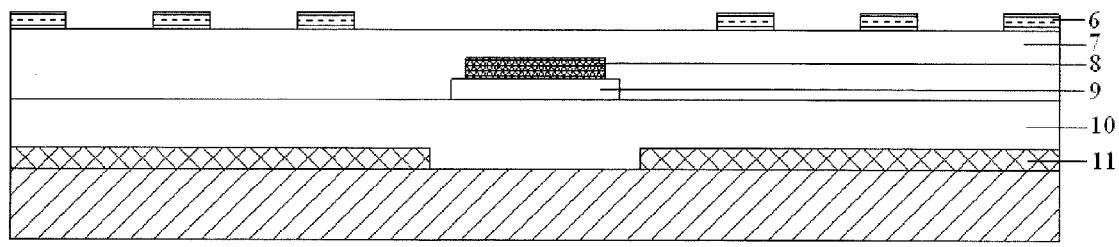
FIG. 3 is a cross-sectional diagram taken in a region of A in FIG. 2.
Figure 4:
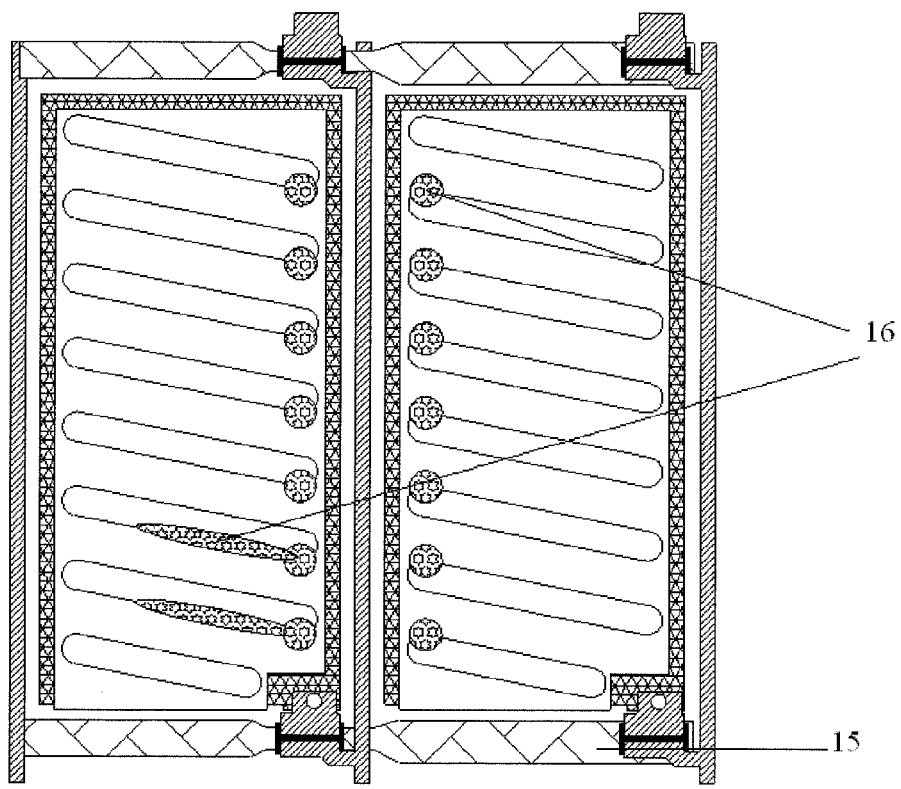
FIG. 4 is a schematic diagram showing a liquid crystal orientation fault of pixels at a touched point when the liquid crystal panel using the ADS technology in the prior art is touched.

In this embodiment, the above step 101 can be performed by using for example processes for manufacturing the array substrate in the prior art, including depositing, photolithograph and etching processes, so as to form the gate lines, common electrodes, the insulation layer, the thin film transistors, the data lines and the passivation layer. As shown in FIG. 2, the thin film transistor may comprise source/drain electrodes 14 (the upper portion is the drain electrode and the lower portion is the source electrode) and a channel region between the source and drain electrodes, and contact holes 13 are formed in the passivation layer. In the embodiments of the present invention, the structure of the thin film transistor and the processes for manufacturing the same are similar to those in the prior art, and the detailed description thereof are omitted here for brevity.

Step 102: providing barrier structures on both sides of the data lines and forming pixel electrodes, each of which is in a slit shape, wherein the barrier structures are located between the pixel electrodes and the common electrodes.

In the embodiments of the present invention, the barrier structures can be formed on portions of the passivation layer or the insulation layer corresponding to the non-displaying regions of the pixel units. In some embodiments of the present invention, after the passivation layer or the insulation layer is formed, the barrier structures are formed by photolithography and etching processes on portions of the passivation layer or the insulation layer corresponding to the non-displaying regions of the pixel units, but the embodiments of the present invention are not limited thereto. For example, in some embodiments of the present invention, after forming the passivation layer or the insulation layer, a film deposition only for the barrier structures are performed on the portions of the passivation layer or the insulation layer corresponding to the non-displaying regions of the pixel units so as to form the barrier structures.

In the embodiments of the present invention, the materials of the barrier structures may include, for example, silicon nitride, silicon dioxide or resin material.

In the embodiments of the present invention, the barrier structures may be convex structures or concave structures.

In an embodiment of the present invention, for example, as shown in FIGS. 5 and 6, on both sides of the data lines, convex structures 17 as the barrier structures are formed on portions of the passivation layer, the insulation layer, the color resin film or the planarizing film corresponding to the non-displaying regions of the pixel units. In this case, a length side of the convex structure is not longer than that of the pixel electrode, and the convex structure has a thickness larger than that of the pixel electrode, or the convex structure can extend to below an end of the pixel electrode so as to raise the end of the pixel electrode.

In an embodiment of the present invention, for example, as shown in FIGS. 7 and 8, on both sides of the data lines, concave structures 18 are formed on portions of the passivation layer 7 corresponding to the non-displaying regions of the pixel units. In some embodiments of the present invention, the concave structures 18 are not formed in the passivation layer 7 but are formed in the insulation layer 10, but the embodiments of the present invention are not limited thereto.

In an embodiment of the present invention, as shown in FIG. 7, in one pixel unit, there may be one concave structure 18 or a plurality of concave structures 18; when the pixel electrode comprises hollow slits, each of the concave structures 18 has a length larger than a width of the slits. In this case, it is possible to overcome the phenomenon of displaying at different luminance or prevent the liquid crystal orientation fault from extending inwardly more effectively.

In the embodiments of the present invention, the convex structures 17 or the concave structures 18 as the barrier structures can be formed by depositing, photolithograph or etching processes; or by printing, pressing or spraying processes.

In the above embodiments of the present invention, the barrier structures for preventing the liquid crystal orientation fault are formed on both sides of the data lines, but the embodiments of the present invention are not limited thereto, and the barrier structures, which are convex structures or concave structures each having a length side shorter than that of the gate line, may be disposed on both sides of the gate lines as well. The embodiment in which the barrier structures are formed on both sides of the gate lines is similar to those in which the barrier structures are formed on both sides of the data lines, and the detailed description thereof are omitted here for brevity.

Another embodiment of the present invention also provides a method for manufacturing an array substrate which excludes common electrodes, so the method is similar to the method for manufacturing the array substrate described above except that the step of forming the common electrodes are omitted in the steps of forming the array substrate. Furthermore, in some embodiments of the present invention, the pixel electrode may be a plate-like electrode, rather than a slit electrode.

The method for manufacturing the array substrate provided in another embodiment of the present invention may comprise, for example, the following steps:

Step 201: forming gate lines, common electrodes, an insulation layer, thin film transistors, data lines and a passivation layer, wherein a plurality of pixel units are defined by intersecting of the gate lines and the data lines; and Step 202: providing barrier structures on both sides of the data lines and forming pixel electrodes.

The methods for manufacturing an array substrate in the previous embodiments of the present invention are also applicable to this method for manufacturing the array substrate, and can also overcome the phenomenon of displaying at different luminance or prevent the liquid crystal orientation fault from extending inwardly, and the detailed description thereof is omitted here for brevity.

The array substrates and the methods for manufacturing the same provided in the above embodiments of the present invention can be applied to not only an ADS structure in which the common electrodes are located below the pixel electrodes, but also an ADS structure in which the common electrodes are located above the pixel electrodes and the in-plane switching (IPS) structure as well as the normal TN structure.

An embodiment of the present invention also provides a liquid crystal display device comprising anyone of the above array substrates. In the embodiments of the present invention, the liquid crystal display device comprises an upper substrate, a lower substrate which is one array substrate described above and a liquid crystal filled between the upper substrate and the lower substrate.

In the embodiment of the present invention, the liquid crystal display device may include a variety of terminal products, including a liquid crystal panel, a liquid crystal television, a liquid crystal displayer, a digital frame, electronic paper, a mobile telephone, etc.

By disposing the barrier structures for preventing the liquid crystal orientation fault on both sides of the data lines or the gate lines, when the liquid crystal panel is touched externally or is applied by pressing, the barrier structures located on both sides of the data lines or the gate lines, especially the portions of the barrier structure not overlapping the data lines can prevent the liquid crystal orientation fault from extending toward the displaying region or the pixel region so as to prevent the phenomenon of displaying at different luminance. Since the film layers between the common electrodes, the pixel electrodes and the data lines are different in height, the electrical field can be controlled so as to preventing the liquid crystal orientation fault and preventing the phenomenon of displaying the picture at different luminance from extending to inside of the pixels.

What are described above is related to the illustrative embodiments of the disclosure only and not limitative to the scope of the disclosure; the scopes of the disclosure are defined by the accompanying claims.

The invention claimed is:

1. An array substrate comprising gate lines, data lines and a plurality of pixel units defined by intersecting of the gate lines and the date lines, each of which comprises a pixel electrode,
wherein barrier structures are disposed on both sides of the data lines or the gate lines, the barrier structures do not overlap with the data lines or the gate lines in a direction vertical to the array substrate, and the barrier structures extend to below an end, which is close to the data lines or the gate lines, of the pixel electrode and overlap part of the pixel electrode in the direction vertical to the array substrate, the pixel electrode is formed on a passivation layer which is arranged on the gate lines or the data lines, an upper surface of the passivation layer is a flat surface, and
the barrier structures are concave structures and are formed in the passivation layer; in a direction parallel to the upper surface of the passivation layer, the concave structures are formed between the pixel electrode and the data lines or the gate lines; and a peripheral portion, of the concave structures, away from the data lines or the gate lines overlaps the end of the pixel electrode.

2. The array substrate according to claim 1, wherein each of the pixel units further comprises a common electrode covering a whole pixel region, the pixel electrode is in a slit shape, and
the barrier structures are located between the pixel electrode and the common electrode.

3. The array substrate according to claim 1, wherein materials of the barrier structures include silicon nitride, silicon dioxide or a resin material.

4. The array substrate according to claim 1, further comprising an insulation layer, wherein the barrier structures are formed in portions of the passivation layer or the insulation layer corresponding to non-displaying regions of the pixel units.

5. The array substrate according to claim 2, wherein the concave structures have a length larger than a width of the slit.

6. A liquid crystal display device comprising a color filter substrate and an array substrate which are assembled together to form a cell, the array substrate comprising gate lines, data lines and a plurality of pixel units defined by intersecting of the gate lines and the date lines, each of which comprises a pixel electrode, wherein barrier structures are disposed on both sides of the data lines and the gate lines, the barrier structures do not overlap with the data lines or the gate lines in a direction vertical to the array substrate, and the barrier structures extend to below an end, which is close to the data lines or the gate lines, of the pixel electrode and overlap part of the pixel electrode in the direction vertical to the array substrate, the pixel electrode is formed on a passivation layer which is arranged on the gate lines or the data lines, and an upper surface of the passivation layer is a flat surface;
wherein the barrier structures are concave structures and are formed in the passivation layer; in a direction parallel to the upper surface of the passivation layer, the concave structures are formed between the pixel electrode and the data lines or the gate lines; and a peripheral portion, of the concave structures, away from the data lines or the gate lines overlaps the end of the pixel electrode; or the barrier structures comprise convex structures which are formed on the passivation layer.

7. The liquid crystal display device according to claim 6, wherein each of the pixel units also comprises a common electrode covering a whole pixel region, the pixel electrode is in a slit shape, and
the barrier structures are located between the pixel electrode and the common electrode.

8. The liquid crystal display device according to claim 6, further comprising an insulation layer, wherein the barrier structures are formed on portions of the passivation layer or the insulation layer corresponding to non-displaying regions of the pixel units.

9. An array substrate comprising gate lines, data lines and a plurality of pixel units defined by intersecting of the gate lines and the date lines, each of which comprises a pixel electrode, wherein barrier structures are disposed on both sides of the data lines or the gate lines, the barrier structures do not overlap with the data lines or the gate lines in a direction vertical to the array substrate, and the barrier structures extend to below an end of the pixel electrode and overlap part of the pixel electrode in the direction vertical to the array substrate, the pixel electrode is formed on a passivation layer which is arranged on the gate lines or the data lines, an upper surface of the passivation layer is a flat surface, and the barrier structures comprise convex structures which are formed on the passivation layer.

10. The array substrate according to claim 9, wherein each of the pixel units further comprises a common electrode covering a whole pixel region, the pixel electrode is in a slit shape, and
the barrier structures are located between the pixel electrode and the common electrode.

11. The array substrate according to claim 9, wherein materials of the barrier structures include silicon nitride, silicon dioxide or a resin material.

12. The array substrate according to claim 9, further comprising an insulation layer, wherein the barrier structures are formed in portions of the passivation layer or the insulation layer corresponding to non-displaying regions of the pixel units.

13. The array substrate according to claim 9, wherein the barrier structures have a length side not longer than that of the pixel electrode.

14. The array substrate according to claim 9, wherein the convex structures have a thickness larger than that of the pixel electrode.

15. The array substrate according to claim 9, wherein in a direction parallel to the upper surface of the passivation layer, the convex structures are formed between the pixel electrode and the data lines or the gate lines.

\* \* \* \* \*